(12) United States Patent
Malherbe

(10) Patent No.: US 6,252,442 B1
(45) Date of Patent: Jun. 26, 2001

(54) ELECTRONIC CIRCUIT PROVIDED WITH A NEUTRALIZATION DEVICE

(75) Inventor: Alexandre Malherbe, Trets (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 08/931,189

(22) Filed: Sep. 16, 1997

(30) Foreign Application Priority Data

Sep. 19, 1996 (FR) .................................................. 96 11636

(51) Int. Cl.[7] .................................................. H03L 7/00
(52) U.S. Cl. .......................................... 327/143; 327/198
(58) Field of Search ..................................... 327/143, 513, 327/189, 80, 81, 198

(56) References Cited

U.S. PATENT DOCUMENTS

| | | | |
|---|---|---|---|
| 5,164,613 | * 11/1992 | Mumper et al. | 327/143 |
| 5,177,375 | * 1/1993 | Ogawa | 307/272.03 |
| 5,243,233 | * 9/1993 | Cliff | 307/296.4 |
| 5,287,011 | * 2/1994 | Koshikawa et al. | 307/272.03 |
| 5,440,255 | * 8/1995 | Fournel | 327/81 |
| 5,446,404 | * 8/1995 | Badyal et al. | 327/143 |
| 5,469,099 | * 11/1995 | Konishi | 327/198 |
| 5,477,176 | 12/1995 | Chang et al. | 327/143 |
| 5,565,807 | * 10/1996 | Ward | 327/205 |
| 5,703,512 | * 12/1997 | McClure | 327/198 |
| 5,780,942 | * 7/1998 | Nakajiima | 307/141 |
| 5,886,549 | * 3/1999 | Naura | 327/143 |

FOREIGN PATENT DOCUMENTS

| | | | |
|---|---|---|---|
| 35 15 611 | 10/1986 | (DE) | G06F/11/28 |
| 0 665 648 | 8/1995 | (EP) | H03K/17/22 |

OTHER PUBLICATIONS

French Search Report from French Patent Application 96 11636, filed Sep. 19, 1996.

* cited by examiner

Primary Examiner—Terry D. Cunningham
Assistant Examiner—Quan Tra
(74) Attorney, Agent, or Firm—Wolf, Greenfield & Sacks, P.C.; James H. Morris; Theodore E. Galanthay

(57) ABSTRACT

A neutralization device is provided that is designed to block the operation of an electronic circuit when this device is insufficiently supplied. The device is designed especially for electronic circuits supplied with low supply voltages. The neutralization device comprises, upline with respect to an inhibiting means to block the operation of the electronic circuit, a control circuit reproducing the critical path or the potential critical paths of the functional electronic circuit in the form of elementary circuits. The deactivation of the inhibiting means is done only when the totality of the elementary circuits deliver same-state elementary signals indicating that the supply voltage is sufficient to ensure their efficient operation. The invention is useful in fields requiring low supply voltages such as mobile telephony or portable microcomputers.

16 Claims, 3 Drawing Sheets

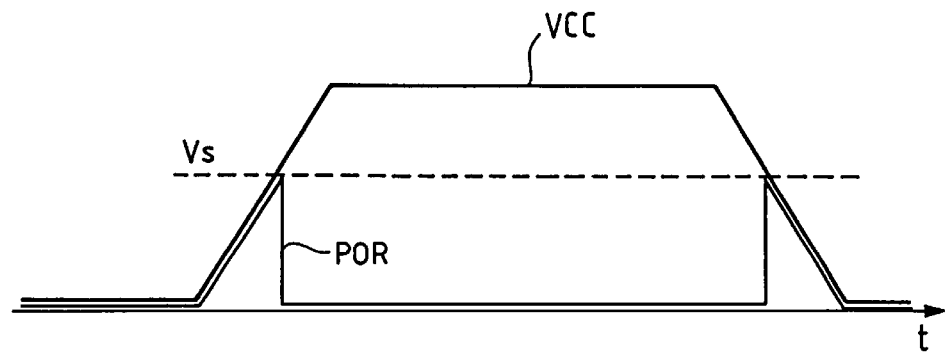
FIG_1
(PRIOR ART)
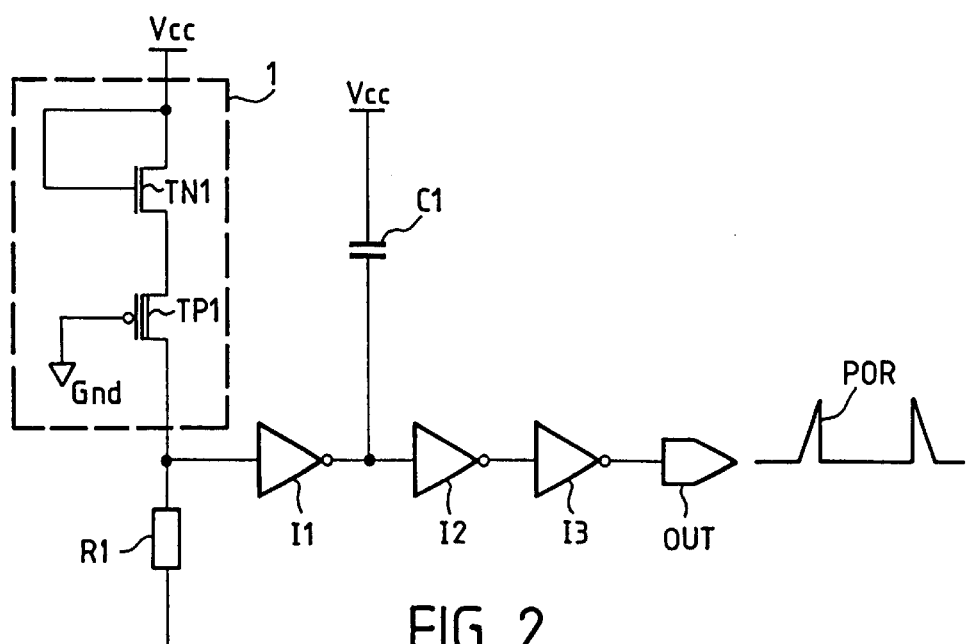
FIG_2
(PRIOR ART)

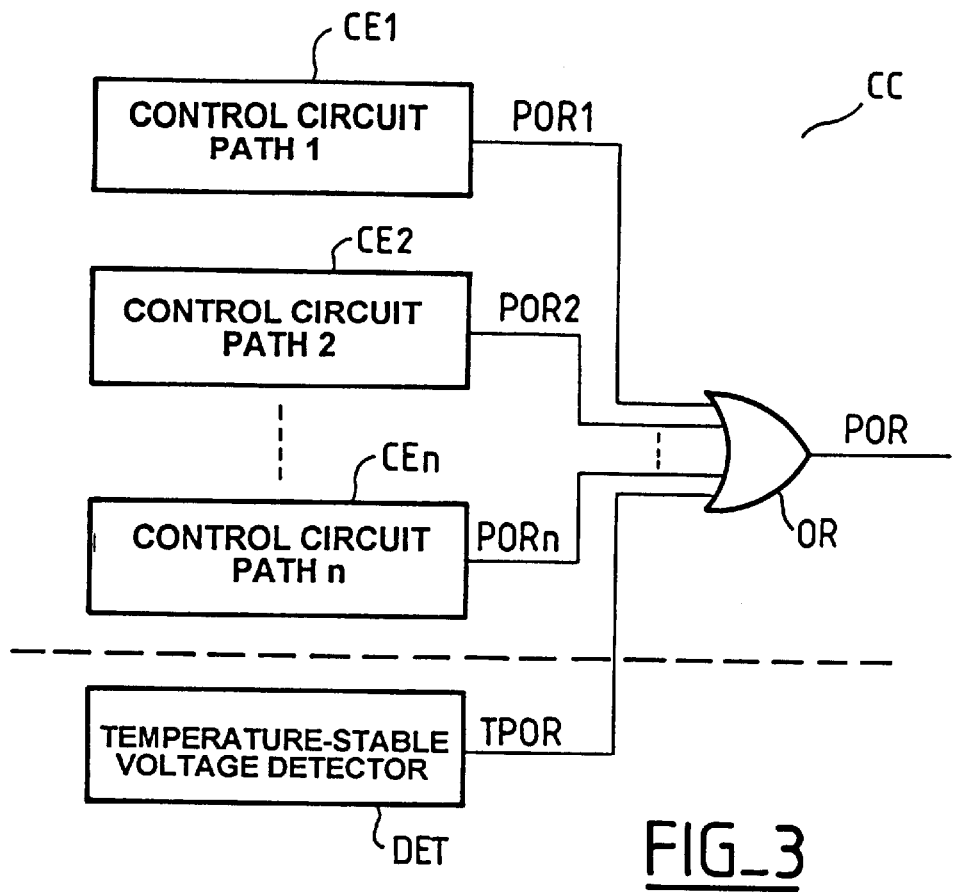
FIG_3
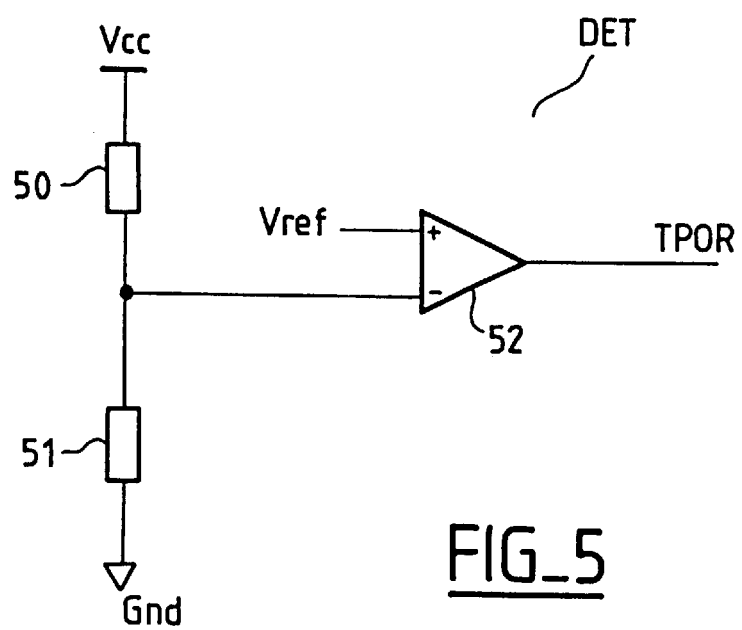
FIG_5

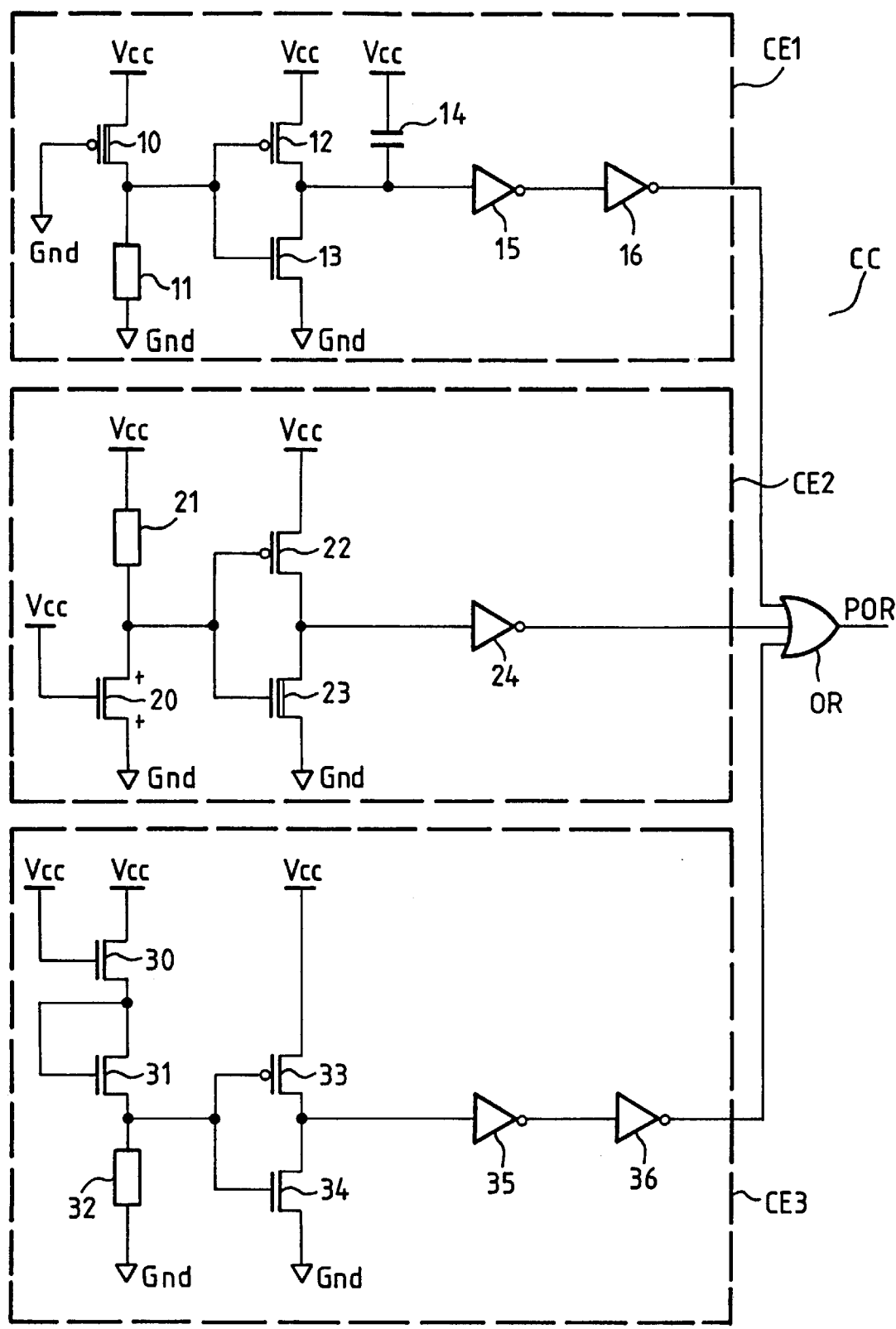
FIG_4

ELECTRONIC CIRCUIT PROVIDED WITH A NEUTRALIZATION DEVICE

BACKGROUND OF THE INVESTMENT

1. Field of the Invention

The present invention relates to the neutralization of an electronic circuit when it is insufficiently powered. The invention is designed especially for circuits supplied with low power voltages. It can be applied especially in mobile telephony, contactless circuits and portable microcomputers.

During the buildup of the supply voltage in an electronic circuit, the functions of the circuit are generally neutralized and made inoperative, otherwise, their operation cannot be ensured. This is also the case when there is a big drop in the supply voltage or when the supply voltage is cut off.

To do this, devices have been developed to neutralize the working of an electronic circuit for supply voltage values below a threshold value. This threshold value is generally determined as a function of the value of the supply voltage and of the electronic circuit to be neutralized.

2. Discussion of the Related Art

Known neutralization devices conventionally comprise a control circuit and a means for inhibiting the working of the electronic circuit. The control circuit delivers the control signal that conditions the output of the inhibiting means. The shape of the control signal is shown in FIG. 1. The curve of the Power-On-Reset control signal referenced POR is superimposed on that of the supply voltage VCC so long as this supply voltage VCC remains below a threshold value Vs. Beyond this value, the voltage value of the control signal POR becomes zero.

The inhibiting means then converts the control signal into a binary signal. When the voltage of the control signal POR is zero, the binary signal has a high logic level. For any other value of the control signal, the binary signal coming from the inhibiting means is at a low level. Thus, for any value of supply voltage greater than the threshold voltage Vs, i.e. when the binary signal has a high level, the operation of the electronic circuit located downline with respect to the inhibiting means is permitted.

The inhibiting means may for example be a flip-flop circuit whose zero-setting input receives the control signal POR and whose "one-setting" input receives a signal for the activation of the electronic circuit. The binary signal coming from the inhibiting means then neutralizes the functions of the electronic circuits placed downline with respect to the inhibiting means when the binary signal delivered by this inhibiting means has a low level.

The control circuit is also the key element of the neutralizing device. FIG. 2 shows a known control circuit made for circuits powered by a voltage of 3 volts. It has a first means 1 to set the threshold value, connected by one input to a supply terminal Vcc and by its output to a ground terminal and by means of a resistor R1. This means 1 comes on when the supply voltage becomes greater than a threshold voltage of its own which is equal to the threshold value Vs.

In the example of FIG. 2, the means 1 consists of an N type transistor TN1 having its gate and drain connected to the supply terminal Vcc and its source connected to the source of a P type native transistor TP1. The drain of the transistor TP1 is connected to the resistor R1 and its gate is connected to the ground terminal And. It may be recalled that a native transistor is a transistor that has received no additional implantation in its conduction channel. Its conduction threshold voltage is greater in terms of absolute value than that of a P type enhanced transistor. In this example, this voltage is in the range of 1.3 volts in terms of absolute value.

The control circuit also includes an inverter I1 connected between the output of the means 1 and an output terminal OUT through which the control signal is delivered. A starting capacitor C1 is connected between the supply terminal Vcc and the output terminal OUT to obtain the output level expected during the beginning of the buildup of the supply voltage.

In this example, the threshold voltage proper to the means 1, representing the threshold value Vs, is equal to the sum of the values of the conduction thresholds of the transistors TN1 and TP1. In practice, it is slightly greater than this value for there must be a sufficient potential difference of the terminals of the resistor R1 to cause the inverter I1 to switch over.

Furthermore, two inverters I2 and I3 are cascade connected between the output of the inverter I1 and the output terminal OUT. These two inverters enable the regeneration of the signals present at the output of the inverter I1. At output of the control circuit, two possible levels are then obtained: a high level or a low level.

Preferably, the commutation ranges of the inverters I2 and I3 are offset with respect to each other in order to increase the stability of these two levels.

In operation, so long as the value of the supply voltage Vcc is below the sum of the conduction thresholds of the transistors TN1 and TP1, the value of the voltage at the input of the inverter I1 is zero. The output terminal OUT of the device then delivers a voltage equal to the supply voltage. As soon as the two transistors TN1 and TP1 become conductive, the output terminal OUT delivers a zero voltage.

In order that the neutralization device may work satisfactorily, there are conditions regarding the threshold voltage Vs. These conditions are taken into account when the control circuit is made. Indeed, the specification of the electronic circuit usually dictates a tolerance range for the value of the supply voltage. This range of tolerance is fixed by the customer. As a rule, it is +/−10% with respect to the nominal value of the supply voltage. The value of the supply voltage therefore ranges between a minimum value $Vcc_{min}$ and a maximum value $Vcc_{max}$.

Furthermore, the threshold value Vs also has a range of uncertainty. Indeed, it is detected by a control circuit made out of components whose parameters may vary with the method of manufacture and the temperature. Hence, the threshold value Vs also varies between a minimum value $Vs_{min}$ and a maximum value $Vs_{max}$.

A first condition in order that the neutralization device may work accurately is the following: $Vs_{max} < Vcc_{min}$. Indeed, should $Vcc = Vcc_{min}$ and $Vs = Vs_{max}$, it is obligatory that Vs should be smaller than Vcc, otherwise the threshold voltage Vs will never be reached by the control circuit and the neutralization device will permanently inhibit the working of the electronic circuit.

This first condition raises a problem if the value of the supply voltage is low. Indeed, the width of the range of uncertainty of the threshold value Vs not only is a function of the value of the supply voltage Vcc but also depends on the parameters of manufacture and of temperature. Although the width of the range of tolerance of the supply voltage diminishes as and when its nominal value diminishes, the width of the range of the threshold value remains almost identical. The above-mentioned first condition becomes increasingly difficult to fulfill.

Furthermore, it is also necessary to consider the fact that the components or groups of components of the electronic circuit to be neutralized have a functional limit Vf below which they no longer fulfill their role. Indeed, if we consider for example a path of current of the electronic circuit comprising two series-connected diodes, it is necessary that the threshold voltage Vs should be greater than the sum of the conduction threshold voltages of the two diodes in order that they may be on and may fulfill their conduction role. Consequently, it is necessary to have $Vs_{min} > Vf_{max}$ where $Vf_{max}$ is the maximum functional limit of the paths of the circuit.

For the electronic circuits supplied with voltages greater than or equal to 3 volts, the difference in voltage between the value of supply voltage $Vcc_{min}$ and the maximum functional limit to $Vf_{max}$ dictated by the electronic circuit is generally great enough for the threshold voltage Vs and its range of uncertainty to be interposed between these two limit values.

For circuits supplied by low voltages in the range of 1.8 volts, this difference is sometimes too small for the threshold voltage Vs to meet both conditions.

The most obvious solution would consist in reducing the size of the range of uncertainty of the threshold voltage Vs. For this purpose, it is necessary to resort to circuits of greater complexity and cost or to improve the performance characteristics of the method of manufacture. This is not always possible and would represent a heavy investment.

According to the approach of the invention, a neutralization device is made enabling the modification of the condition relating to the functional limit Vf.

The electronic circuit to be neutralized is divided into circuit portions combining one or more components on one and the same current path. Generally, one of these paths is said to be critical for it requires a minimum supply voltage Vf that is greater than the others for the efficient operation of the circuit portion pertaining thereto. This value of the supply voltage defines the value of the functional limit Vf of the circuit.

For one and the same circuit structure, there may sometimes be several potential critical paths owing to the variation of parameters inherent to the manufacturing method and to the operating temperature of the circuit.

In the control circuit of the invention, the potential critical paths of the electronic circuit are reproduced and arranged so as to determine a threshold voltage Vs that will be equal to the value of the maximum limit Vf of the electronic circuit for given conditions of temperature and manufacturing method. The condition $Vs_{min} > Vf_{max}$ will no longer have to be met since $V_s Vf_{max}$. In practice, this neutralization device and the electronic circuit are made on the same chip and are subjected to the same conditions of temperature and manufacturing method.

SUMMARY OF THE INVENTION

One embodiment of the invention provides a set comprising a functional electronic circuit and a neutralization device designed to block the operation of said functional electronic circuit when the supply voltage is not sufficient to ensure its efficient operation. The functional electronic circuit includes one critical path or several potential critical paths between a supply terminal and a ground terminal, a path being critical when the value of the supply voltage necessary to ensure the efficient operation of its component or group of components is sufficient to ensure the efficient operation of the set.

The neutralization device includes, upstream with respect to an inhibiting means to block the operation of the electronic circuit, a control circuit reproducing the critical path or the potential critical paths of the functional electronic circuit in the form of elementary circuits, each connected between the supply terminal and the ground terminal and delivering an elementary signal which, by its state, indicates whether the supply voltage is sufficient to ensure its efficient operation. The inhibiting means is deactivated only when the totality of the elementary circuits deliver same-state elementary signals indicating that the supply voltage is sufficient to ensure their efficient operation.

In order to take account of all the signals coming from the elementary circuits, the control circuit of the neutralization device comprises a logic gate receiving an elementary signal at each of its inputs and delivering a control signal to the inhibiting means.

Preferably, the critical path or the potential critical paths of the electronic circuit are reproduced in the elementary circuits with low-resistance components or groups of low-resistance components so that the components are freely conductive from the very beginning of their being placed in a state of conduction.

To do this, it is provided that transistors will be used with a W/L ratio smaller than or equal to 1.

Furthermore, the control circuit of the neutralization device may also include an additional elementary circuit producing an elementary signal that changes its state for a fixed value of the supply voltage. This fixed value is determined in such a way that it is a minimum threshold value of the supply voltage capable of ensuring the deactivation of the inhibiting means. This additional circuit is used to limit the interval of variation of the threshold voltage Vs of the set, namely the supply voltage needed to ensure the efficient operation of the set. This additional circuit is, for example, a temperature-stable voltage detector.

BRIEF DESCRIPTION OF THE DRAWINGS

The invention will be understood more clearly from the following description and from the appended figures. These figures are given purely by way of an indication and in no way limit the scope of the invention. Of these figures:

FIG. 1 shows a timing diagram for a control signal coming from a control circuit;

FIG. 2 shows a schematic view of a control circuit for a known neutralization device;

FIG. 3 shows a functional diagram of a control circuit of a neutralization device according to one embodiment of the invention;

FIG. 4 shows an exemplary embodiment of a control circuit of a neutralization device according to one embodiment of the invention;

FIG. 5 shows a schematic view of a temperature-stable voltage detector of a neutralization device according to one embodiment of the invention.

DETAILED DESCRIPTION

FIG. 3 is a functional diagram of a control circuit CC of a neutralization circuit according to the invention.

This control circuit CC comprises first of all n elementary circuits CE1 ... CEn, each representing a critical path of the electronic circuit. Of course, in the case of a very simple electronic circuit, it could have only one critical path. The contents of the elementary circuits therefore depend on the structure of the electronic circuit to be neutralized in that they take up portions of this circuit. Obviously, the threshold voltage Vs of the elementary circuits meets the first condition stated here above.

Each elementary circuit CE1 ... CEn delivers an elementary control signal POR1 ... PORn. The shape of the elementary signals is equivalent to that of the signal POR of FIG. 1. An OR logic gate receives an elementary control signal POR1 ... PORn at each of its inputs and delivers a common control signal POR intended to control an inhibiting means (not shown) placed downline from the control circuit CC. The logic gate is an OR type logic gate because all the elementary signals POR1 ... PORn must have a low logic level to deactivate the inhibiting means.

A temperature-stable voltage detector DET is also provided in the control circuit CC. It delivers a temperature-stable elementary control signal TPOR at an additional input of the OR gate. The signal TPOR is used to limit the interval of variation of the threshold voltage Vs of the control signal POR. The value of the voltage signal TPOR is preferably taken to be equal to the mean value of the threshold voltage Vs. Thus, if for given conditions of method and temperature, the elementary circuits lead to the obtaining of a low threshold value Vs, the voltage signal TPOR will enable the increasing of the threshold voltage value Vs of the control signal POR. The temperature-stable voltage detector DET shall be described in the part of the description pertaining to FIG. 5.

An exemplary control circuit according to the invention is described in FIG. 4. In this example, the electronic circuit placed downline from this control circuit has three critical paths on the temperature interval of the specification. Consequently, the control circuit has three corresponding elementary circuits CE1, CE2, CE3.

The first elementary circuit CE1 is used to detect the threshold value of a first critical path of the electronic circuit comprising a P type native transistor. To do this, the circuit CE1 has a P type native transistor 10 having its source connected to a supply terminal Vcc and its gate to a ground terminal Gnd. The drain of the native transistor 10 is also connected to the ground terminal Gnd by means of the bias resistor 11. This resistor is sized so as to obtain, for example, a bias current of 1 $\mu$A approximately. The drain of the native transistor 10 is also connected to the input of a first conventional inverter formed by transistors 12 and 13 which are respectively P type and N type transistors. The output of this inverter is connected to an input of the OR logic gate by means of two inverters 15 and 16. A starting capacitor 14 is also provided between the output of the first inverter and the supply terminal Vcc to obtain a logic "1" at the output of the first inverter at the beginning of the buildup of the supply voltage VCC.

The second elementary circuit CE2 is used to detect the threshold value of a second critical path of the electronic circuit comprising an N type high-voltage transistor. An N type high-voltage transistor is a transistor whose gate oxide thickness is greater than that of a conventional transistor. To this end, the elementary circuit CE2 has a high-voltage transistor 20 having its gate connected to the supply terminal Vcc and its source connected to the ground terminal Gnd. The drain of this transistor is, for its part, connected firstly to the supply terminal Vcc by means of a bias resistor 21 and secondly to the input of the inverter consisting of a P type transistor 22 and an N type native transistor 23. Finally, the output of the inverter is connected to a second input of the OR logic gate by means of a second inverter 24. The conduction threshold of the native transistor 23 is very low, in the range of 0.2 volts. Thus, the output of the inverter formed by the transistors 22 and 23 will deliver a logic "0" from the very beginning of the supply voltage ramp.

Finally, the elementary circuit CE3 is used to detect the conduction threshold of a third critical path of the electronic circuit comprising two series-connected N type transistors. The diagram of the elementary circuit CE3 is identical to the diagram of the circuit CE1. The transistor 10 however is replaced by two series-connected N type transistors 30, 31. The gate and the drain of the transistor 30 are connected to the supply terminal Vcc while its source is connected to the drain and the gate of the transistor 31. Naturally, the bias resistor referenced 32, having one of its terminals connected to the source of the transistor 31, is sized as a function of the transistors 30 and 31. The output of this third elementary circuit is connected to a third input of the OR gate.

The working of each of the elementary circuits CE1, CE2 and CE3 corresponds to the working of the control circuit of FIG. 2.

Preferably, the components reproducing the critical paths of the electronic circuit, namely the transistors 10, 20, 30 and 31, are made with a conduction resistance ($r_{on}$) that is weak so that they let through current freely as soon as their conduction voltage is reached. To do this, these transistors are designed with a small W/L ratio that is smaller than or equal to 1.

As mentioned in the description of FIG. 3, the control circuit of the invention can be complemented by a temperature-stable voltage detector DET to limit the interval of variation of the threshold voltage Vs of the control signal POR. This circuit acts when the conditions of temperature and the manufacturing method used are such that all the elementary circuits permit the operation of the functional electronic circuit at a low supply voltage. The output signal of a circuit of this kind changes its state for a determined value of the supply voltage, which will preferably be equal to the mean value of the voltage Vs. FIG. 5 describes a possible diagram of a temperature-stable voltage detector.

The detector DET has a bridge of resistors 50, 51 connected between the supply terminal Vcc and the ground terminal Gnd. The midpoint of the bridge of resistors 50, 51 is connected to the negative input terminal of a differential amplifier 52. The positive input terminal of this amplifier receives a reference voltage Vref given by a bandgap circuit. The differential amplifier 52 delivers a temperature-stable temperature signal TPOR at its output.

The working of the detector DET shall be explained by assuming that the electronic circuit is supplied with a voltage of 1.8 volts. It is assumed furthermore that the mean value of the threshold voltage Vs is equal to 1.4 volts and that the bandgap circuit is a standard circuit delivering a temperature-stable voltage of 1.27 volts.

The values of the resistors 50 and 51 are then chosen so that the voltage at the negative input of the amplifier 52 is equal to 1.27 volts when the value of the supply voltage reaches 1.4 volts. In this example, the voltage at the midpoint of the bridge of resistors is necessarily independent of the temperature for the resistors 50 and 51 vary in the same proportions with the temperature.

The elementary signal TPOR changes its state when its values exceed 1.4 volts. The minimum threshold value $Vs_{min}$ then becomes equal to 1.4 volts for given parameters of manufacture. This additional circuit thus enables the interval of variation of the threshold voltage Vs to be limited.

Having thus described at least one illustrative embodiment of the invention, various alterations, modifications, and improvements will readily occur to those skilled in the art.

Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A neutralization device for controlling an inhibiting circuit that blocks the operation of an electronic circuit when a supply voltage for the electronic circuit is not sufficient to ensure efficient operation of the electronic circuit, the electronic circuit having a plurality of critical paths, each critical path being between a supply terminal and a ground terminal, and having a value of the supply voltage associated therewith that is necessary to ensure the efficient operation of a component or group of components in the critical path, the neutralization device comprising:

a control circuit including a plurality of elementary circuits, each elementary circuit being a reproduction of the component or group of components of one of critical paths associated therewith, wherein each elementary circuit is connected between a supply terminal of the supply voltage and a ground terminal, and generates an elementary signal which, by its state, indicates whether the supply voltage is sufficient to ensure the efficient operation of the critical path associated therewith, the inhibiting circuit being deactivated by the control circuit only when an elementary signal indicates that the supply voltage is sufficient to ensure the efficient operation of the component or group of components in one of said critical paths, wherein the neutralization device further comprises a logic gate for receiving a plurality of elementary signals from the plurality of elementary circuits and for delivering a control signal to the inhibiting circuit.

2. The device according to claim 1, wherein at least one critical path of the electronic circuit is reproduced in at least one elementary circuit with low-resistance components.

3. The device according to claim 2, wherein the at least one critical path of the electronic circuit comprises a P type native transistor.

4. A neutralization device for controlling an inhibiting circuit that blocks the operation of an electronic circuit when a supply voltage for the electronic circuit is not sufficient to ensure efficient operation of the electronic circuit, the electronic circuit having at least one critical path between a supply terminal and a ground terminal, the at least one critical path having a value of the supply voltage associated therewith that is necessary to ensure the efficient operation of a component or group of components in the at least one critical path, the neutralization device comprising:

a control circuit including at least one elementary circuit that is a reproduction of the component or group of components of the at least one critical path of the electronic circuit, wherein the at least one elementary circuit is connected between a supply terminal of the supply voltage and a ground terminal, and wherein the at least one elementary circuit generates an elementary signal which, by its state, indicates whether the supply voltage is sufficient to ensure the efficient operation of the at least one critical path corresponding to the at least one elementary circuit, the inhibiting circuit being deactivated by the control circuit only when the elementary signal indicates that the supply voltage is sufficient to ensure the efficient operation of the component or group of components in the at least one critical path, wherein the at least one critical path of the electronic circuit is reproduced in the at least one elementary circuit with low-resistance components, and wherein the at least one critical path of the electronic circuit comprises an N type high-voltage transistor.

5. The device according to claim 2, wherein the at least one critical path of the electronic circuit comprises two series-connected N type transistors, one of which is diode-mounted.

6. The device of claim 1, wherein the control circuit of the neutralization device further comprises an additional elementary circuit for producing an elementary signal that changes its state when the supply voltage is above a particular fixed value, this fixed value being a minimum threshold value of the supply voltage capable of ensuring the deactivation of the inhibiting means.

7. The device according to claim 6, wherein the additional elementary circuit is insensitive to changes temperature.

8. The neutralization device of claim 1, in combination with the electronic circuit.

9. A control circuit for activating and deactivating an inhibiting circuit that prevents an electronic circuit from operating when a supply voltage to the electronic circuit is below a particular value, the control circuit comprising:

a plurality of control circuit paths that correspond to a plurality of critical paths in the electronic circuit, each control circuit path adapted to be coupled to the supply voltage, wherein each control circuit path and its corresponding critical path contain common circuit components so that when the supply voltage is above an operating threshold of the control circuit path the supply voltage is also above an operating threshold of the corresponding critical path, a logic gate coupled to the plurality of control circuit paths, the logic gate adapted to be coupled to the inhibiting circuit, and wherein the control circuit generates a signal that deactivates the inhibiting circuit when the supply voltage is above one of the operating thresholds of the plurality of control circuit paths.

10. The circuit of claim 9, further comprising a voltage detector coupled to the logic gate and adapted to compare the supply voltage to a reference voltage corresponding to a minimum threshold value of the supply voltage capable of ensuring deactivation of the inhibiting circuit.

11. The circuit of claim 10, wherein the voltage detector includes a pair of resistors coupled between the supply voltage and ground.

12. The circuit of claim 11, wherein the voltage detector includes a differential amplifier coupled to a midpoint of the pair of resistors.

13. The control circuit of claim 9, in combination with the electronic circuit.

14. A neutralization device for controlling an inhibiting circuit that blocks the operation of an electronic circuit when a supply voltage for the electronic circuit is not sufficient to ensure efficient operation of the electronic circuit, the electronic circuit having a plurality of critical paths, each critical path being between a supply terminal and a ground terminal, and having a value of the supply voltage associated therewith that is necessary to ensure the efficient operation of a component or group of components in the critical path, the neutralization device comprising:

a control circuit including a plurality of elementary circuits coupled to said inhibiting circuit, each elementary circuit being a reproduction of the component or group of components of one of critical paths associated therewith, wherein each elementary circuit is connected between a supply terminal of the supply voltage and a ground terminal, and generates an elementary signal which, by its state, indicates whether the supply voltage is sufficient to ensure the efficient operation of the critical path associated therewith, the inhibiting circuit being deactivated by the control circuit only when an elementary signal indicates that the supply voltage is sufficient to ensure the efficient operation of the component or group of components in one of said critical paths.

15. The circuit of claim 14, further comprising a logic gate to which each elementary circuit is coupled, wherein an output of the logic gate is coupled to the inhibiting circuit.

16. The device of claim 14, wherein each elementary circuit generates an elementary signal which, by its state, indicates whether the supply voltage is sufficient to ensure the efficient operation of the critical path associated therewith, the inhibiting means being deactivated by the control circuit only when all elementary signals indicate that the supply voltage is sufficient to ensure the efficient operation of all the critical paths.

* * * * *